(12) United States Patent
Koo et al.

(10) Patent No.: US 8,198,148 B2
(45) Date of Patent: Jun. 12, 2012

(54) METHOD FOR MANUFACTURING SEMICONDUCTOR DEVICE

(75) Inventors: Jae Bon Koo, Daejeon (KR); Seung Youl Kang, Deajeon (KR); In-Kyu You, Deajeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 184 days.

(21) Appl. No.: 12/766,953

(22) Filed: Apr. 26, 2010

(65) Prior Publication Data

US 2011/0136296 A1 Jun. 9, 2011

(30) Foreign Application Priority Data

Dec. 7, 2009 (KR) .................... 10-2009-0120620

(51) Int. Cl.
*H01L 21/84* (2006.01)
(52) U.S. Cl. . 438/164; 438/151; 438/458; 257/E21.561; 257/E21.568; 257/623
(58) Field of Classification Search .................. 438/39, 438/40, 42, 43, 670, 704, 739, 151, 164, 438/458; 257/623, E21.561, E21.568
See application file for complete search history.

(56) References Cited

U.S. PATENT DOCUMENTS

| | | | | |
|---|---|---|---|---|
| 4,846,931 A | * | 7/1989 | Gmitter et al. | 438/26 |
| 4,883,561 A | * | 11/1989 | Gmitter et al. | 438/27 |
| 5,691,230 A | * | 11/1997 | Forbes | 438/412 |
| 6,093,623 A | * | 7/2000 | Forbes | 438/455 |
| 6,143,582 A | * | 11/2000 | Vu et al. | 438/30 |
| 6,309,950 B1 | * | 10/2001 | Forbes | 438/455 |
| 6,414,783 B2 | * | 7/2002 | Zavracky et al. | 359/291 |
| 6,424,020 B1 | * | 7/2002 | Vu et al. | 257/507 |
| 6,521,940 B1 | * | 2/2003 | Vu et al. | 257/315 |
| 6,538,330 B1 | * | 3/2003 | Forbes | 257/777 |
| 6,627,953 B1 | * | 9/2003 | Vu et al. | 257/347 |
| 6,656,819 B1 | * | 12/2003 | Sugino et al. | 438/460 |
| 6,700,631 B1 | | 3/2004 | Inoue et al. | |

(Continued)

FOREIGN PATENT DOCUMENTS

EP 1463105 A2 9/2004

(Continued)

OTHER PUBLICATIONS

Satoshi Inoue et al., "Surface-Free Technology by Laser Annealing (SUFTLA) and Its Applications to Poly-Si TFT-LCDs on Plastic Film With Integrated Drivers" IEEE Transactions on Electron Devices, vol. 49, No. 8, pp. 1353-1360, Aug. 2002.

(Continued)

*Primary Examiner* — David Vu
*Assistant Examiner* — Earl Taylor
(74) *Attorney, Agent, or Firm* — Rabin & Berdo, P.C.

(57) ABSTRACT

Provided is a method for manufacturing a semiconductor device. The method includes: providing a first substrate where an active layer is formed on a buried insulation layer; forming a gate insulation layer on the active layer; forming a gate electrode on the gate insulation layer; forming a source/drain region on the active layer at both sides of the gate electrode; exposing the buried insulation layer around a thin film transistor (TFT) including the gate electrode and the source/drain region; forming an under cut at the bottom of the TFT by partially removing the buried insulation layer; and transferring the TFT on a second substrate.

20 Claims, 12 Drawing Sheets

U.S. PATENT DOCUMENTS

| | | | |
|---|---|---|---|
| 7,244,990 B2* | 7/2007 | Takafuji et al. | 257/347 |
| 7,427,526 B2 | 9/2008 | Fonash et al. | |
| 7,557,367 B2* | 7/2009 | Rogers et al. | 257/9 |
| 7,585,703 B2* | 9/2009 | Matsumura et al. | 438/128 |
| 7,622,367 B1* | 11/2009 | Nuzzo et al. | 438/472 |
| 7,659,178 B2* | 2/2010 | Cheng et al. | 438/409 |
| 7,662,545 B2* | 2/2010 | Nuzzo et al. | 430/322 |
| 7,799,699 B2* | 9/2010 | Nuzzo et al. | 438/758 |
| 7,919,392 B2* | 4/2011 | Takafuji et al. | 438/455 |
| 7,973,336 B2* | 7/2011 | Savage et al. | 257/190 |
| 7,982,296 B2* | 7/2011 | Nuzzo et al. | 257/679 |
| 2002/0096994 A1* | 7/2002 | Iwafuchi et al. | 313/495 |
| 2002/0115265 A1* | 8/2002 | Iwafuchi et al. | 438/458 |
| 2002/0171089 A1* | 11/2002 | Okuyama et al. | 257/88 |
| 2003/0011377 A1* | 1/2003 | Oohata et al. | 324/512 |
| 2003/0034120 A1* | 2/2003 | Yanagisawa et al. | 156/238 |
| 2003/0057425 A1* | 3/2003 | Zavracky et al. | 257/88 |
| 2003/0087476 A1* | 5/2003 | Oohata et al. | 438/108 |
| 2003/0160258 A1* | 8/2003 | Oohata | 257/99 |
| 2003/0162463 A1* | 8/2003 | Hayashi et al. | 445/24 |
| 2003/0170971 A1* | 9/2003 | Tomoda et al. | 438/602 |
| 2004/0080032 A1* | 4/2004 | Kimura et al. | 257/678 |
| 2004/0183133 A1* | 9/2004 | Takafuji et al. | 257/347 |
| 2006/0038182 A1* | 2/2006 | Rogers et al. | 257/77 |
| 2006/0055864 A1* | 3/2006 | Matsumura et al. | 349/187 |
| 2006/0138541 A1* | 6/2006 | Nakamura et al. | 257/347 |
| 2007/0032089 A1* | 2/2007 | Nuzzo et al. | 438/725 |
| 2007/0235734 A1* | 10/2007 | Takafuji et al. | 257/57 |
| 2009/0199960 A1 | 8/2009 | Nuzzo et al. | |
| 2009/0269907 A1* | 10/2009 | Takafuji et al. | 438/458 |
| 2009/0294803 A1* | 12/2009 | Nuzzo et al. | 257/213 |
| 2010/0002402 A1* | 1/2010 | Rogers et al. | 361/749 |
| 2010/0072577 A1* | 3/2010 | Nuzzo et al. | 257/618 |
| 2010/0289124 A1* | 11/2010 | Nuzzo et al. | 257/618 |
| 2011/0136296 A1* | 6/2011 | Koo et al. | 438/106 |

FOREIGN PATENT DOCUMENTS

KR     1020060113449 A     11/2006

OTHER PUBLICATIONS

Tatsuya Shimoda et al., "Surface Free Technology by Laser Annealing (SUFTLA)" IEEE IEDM 99-289, pp. 12.1.1-12.1.4, 1999.

* cited by examiner

METHOD FOR MANUFACTURING SEMICONDUCTOR DEVICE

CROSS-REFERENCE TO RELATED APPLICATIONS

This U.S. non-provisional patent application claims priority under 35 U.S.C. §119 of Korean Patent Application No. 10-2009-0120620, filed on Dec. 7, 2009, the entire contents of which are hereby incorporated by reference.

BACKGROUND OF THE INVENTION

The present invention disclosed herein relates to a method for manufacturing a semiconductor device, and more particularly, to a method for manufacturing a semiconductor device, which forms a thin film transistor (TFT) on a plastic substrate.

In general, an Organic Thin Film Transistor (OTFT) is extensively used in a flexible display driving device or a Radio Frequency Identification (RFID) application device. When an organic material is used for a channel layer in the OTFT, since conduction mechanism and crystallity are defective, mobility of more than 1 $cm^2/Vs$ may not be easily realized. Although the OTFT is used for realizing a flexible electronic device, since it has a short life cycle and its driving reliability is deteriorated while being exposed to atmosphere, it is difficult to achieve mass production.

Accordingly, due to a technical deadlock state of the OTFT with limitations related to a life cycle and reliability and its increased demand for a special purpose high-speed flexible device, recently suggested is an alternative technique that an existing silicon substrate semiconductor is detached from a wafer substrate and is transferred on a plastic substrate.

SUMMARY OF THE INVENTION

The present invention provides a method for manufacturing a semiconductor, which can increase or maximize production yield by completing the formation of a thin film transistor (TFT) on a semiconductor substrate and then transferring the TFT on a plastic substrate.

Embodiments of the present invention provide methods for manufacturing a semiconductor device, the methods including: providing a first substrate where an active layer is formed on a buried insulation layer; forming a gate insulation layer on the active layer; forming a gate electrode on the gate insulation layer; forming a source/drain region on the active layer at both sides of the gate electrode; exposing the buried insulation layer around a thin film transistor (TFT) including the gate electrode and the source/drain region; forming an under cut at the bottom of the TFT by partially removing the buried insulation layer; and transferring the TFT on a second substrate.

In some embodiments, the gate insulation layer and the buried insulation layer may be formed of insulation layer materials of respectively different kinds.

In other embodiments, the buried insulation layer may be formed of a silicon oxide layer and the gate insulation layer is formed of a silicon nitride layer.

In still other embodiments, the exposing of the buried insulation layer may include: forming a photoresist pattern on the TFT; and etching the gate insulation layer by using the photoresist pattern as an etching mask.

In even other embodiments, the gate insulation layer may be etched using a dry etching method.

In yet other embodiments, the dry etching method may use CF-based gas.

In further embodiments, the buried insulation layer may be removed using a wet etching method that uses the photoresist pattern and the gate insulation layer as an etching mask.

In still further embodiments, the wet etching method of the buried insulation layer may use buffered HF solution.

In even further embodiments, after the etching of the buried insulation layer, the methods may further include performing a hard bake process on the photoresist pattern.

In yet further embodiments, the methods may further include fixing the photoresist pattern at a stamp.

In yet further embodiments, the stamp may include Polydimethylsiloxane (PDMS) on a surface that contacts the photoresist pattern.

In yet further embodiments, the photoresist pattern may be exposed to UltraViolet (UV) before being fixed at the stamp.

In yet further embodiments, the photoresist pattern may be removed by development solution after the TFT is transferred on the second substrate.

In yet further embodiments, the gate insulation layer and the gate electrode may be formed into a gate stack on the active layer.

In yet further embodiments, after the forming of the source/drain region, the methods may further include forming an interlayer insulation layer that is formed of a material different from the buried insulation layer on the gate electrode and the active region.

In yet further embodiments, the buried insulation layer may be formed of a silicon oxide layer and the interlayer insulation layer may be formed of a silicon nitride layer.

In yet further embodiments, the exposing of the buried insulation layer may include: forming a photoresist pattern on the interlayer insulation layer above the TFT; and etching the interlayer insulation layer by using the photoresist pattern as an etching mask.

In yet further embodiments, the interlayer insulation layer may be etched using a dry etching method.

In yet further embodiments, the buried insulation layer may be removed by a wet etching method that uses the photoresist pattern and the interlayer insulation layer as an etching mask.

In yet further embodiments, the methods may further include separating the active layer before the forming of the gate insulation layer.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
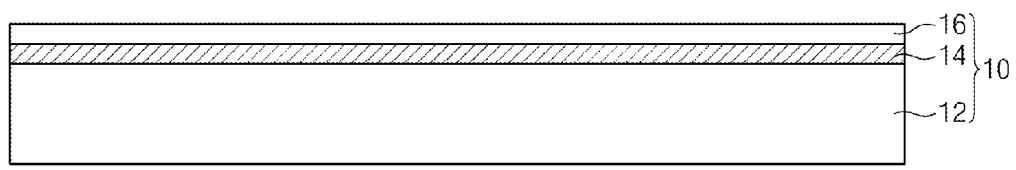
FIGS. 1 through 11 are manufacturing sectional views illustrating a method for manufacturing a semiconductor device according to a first embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Hereinafter, first and second embodiments will be described about an exemplary embodiment of the present invention in conjunction with the accompanying drawings.

First Embodiment

In relation to a method for manufacturing a semiconductor device according to a first embodiment of the present invention, since a buried insulation layer of a Silicon On Insulator (SOI) substrate and a gate insulation layer of a Thin Film Transistor (TFT) are formed of respectively different kinds of materials, the method prevents the gate insulation layer from being damaged by an etching solution of the buried insulation layer during separating of the TFT from the SOI substrate.

FIGS. 1 through 11 are manufacturing sectional views illustrating the method for manufacturing a semiconductor device according to the first embodiment of the present invention.

Referring to FIG. 1, a first substrate 10, where a buried insulation layer 14 and an active layer 16 are stacked, is prepared on a single crystalline silicon wafer 12. The buried insulation layer 14 and the active layer 16 may be formed on the single crystalline silicon wafer 12. The buried insulation layer 14 includes a silicon oxide layer and the active layer 16 includes a single crystalline silicon layer. For example, the first substrate 10 may include a SOI substrate with the active layer 16 whose thickness is about 290 nm.

Figure 2:
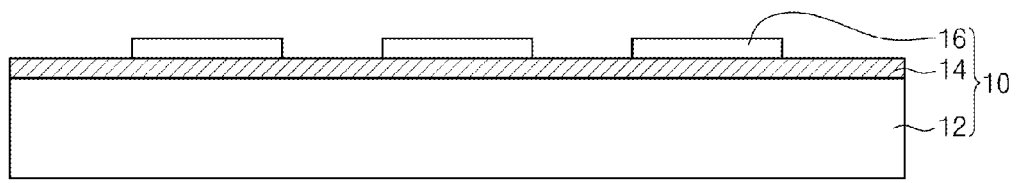

Referring to FIG. 2, the active layer 16 of the first substrate 10 is divided. Here, the active layer 16 may be formed of an opaque single crystalline silicon thin layer used as a channel layer of a TFT. Accordingly, an island process of the active layer 16 may be a process that is required for improving transmittivity in a display device using a TFT. For example, the active layer 16 may be divided through a first photolithography process and a first etching process.

Figure 3:
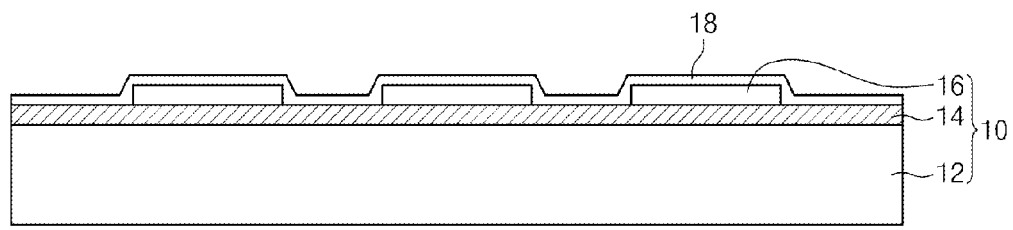

Referring to FIG. 3, a gate insulation layer 18 is formed on an entire surface of the first substrate 10 including the active layer 16. The gate insulation layer 18 may include a silicon nitride (SiN) layer formed using a Chemical Vapor Deposition (CVD) method or an Atomic Layer Deposition (ALD) method. The CVD method or the ALD method is performed at a high temperature of more than about 200° C. For example, the gate insulation layer 18 may be formed with a thickness of about 30 Å to about 300 Å.

Figure 4:
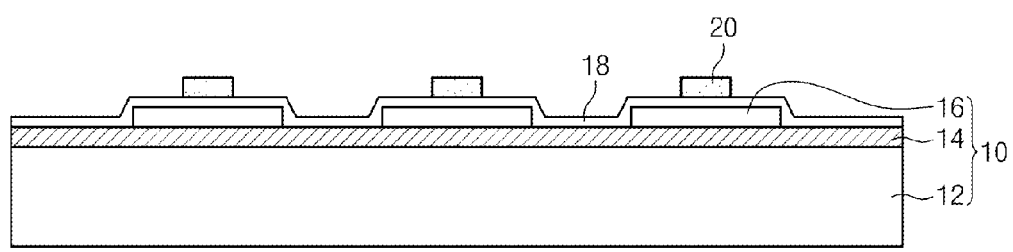

Referring to FIG. 4, a gate electrode 20 is formed on the gate insulation layer 18 above the active layer 16. The gate electrode 20 may include conductive metal, poly silicon doped with conductive impurity, or metal silicide, which is formed on the gate insulation layer 18. The gate electrode 20 is a place to which a switching voltage for inducing a channel in the active layer 16 below the gate insulation layer 18 is applied and may be separately patterned above the active layer 16. For example, after a conductive metal is deposited on the gate insulation layer 18, the gate electrode 20 is formed through a second photolithography process and a second etching process.

Figure 5:
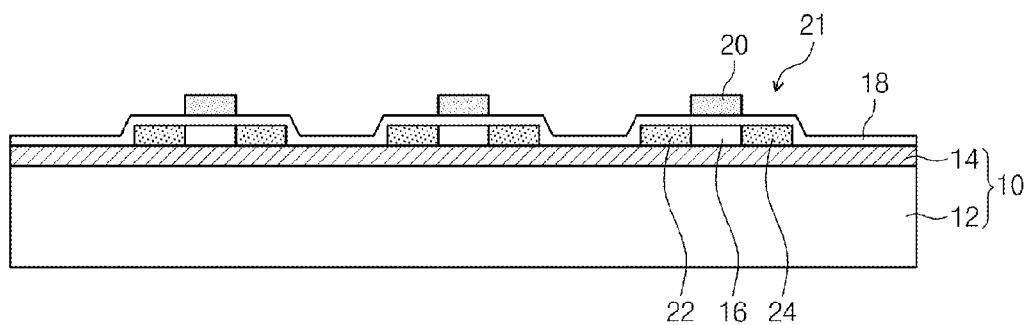

Referring to FIG. 5, source/drain impurity regions 22 and 24 are formed by ion-implanting conductive impurity on active regions at both sides of the gate electrode 20. The source/drain impurity regions 22 and 24 may be formed through a self align ion implantation method that uses the gate electrode 20 as an ion implantation mask. During the ion implantation, the conductive impurity may be ion-implanted into the active layer 16 through the gate insulation layer 18.

In addition, the conductive impurity may include a p-type impurity of group III elements such as B, Ga, and In, and an n-type impurity of group V elements such as Sb, As, and P. The TFT 21 may be formed into a P-type Metal Oxide Semiconductor (PMOS) transistor or an N-type Metal Oxide Semiconductor (NMOS) transistor, depending on kinds of conductive impurities that are ion-implanted into the source/drain impurity regions 22 and 24. When PMOS and NMOS TFTs 21 are simultaneously designed on the first substrate 10, it is necessary to sequentially ion-implant conductive impurities of different kinds into respectively different regions. Each time conductive impurity is ion-implanted, a photolithography process is necessarily required in order to form an ion implantation mask that selectively exposes a corresponding region. Accordingly, when the PMOS and NMOS TFTs 21 are realized on the first substrate 10 at the same time, a plurality of photolithography processes and ion implantation processes are additionally required.

Figure 6:
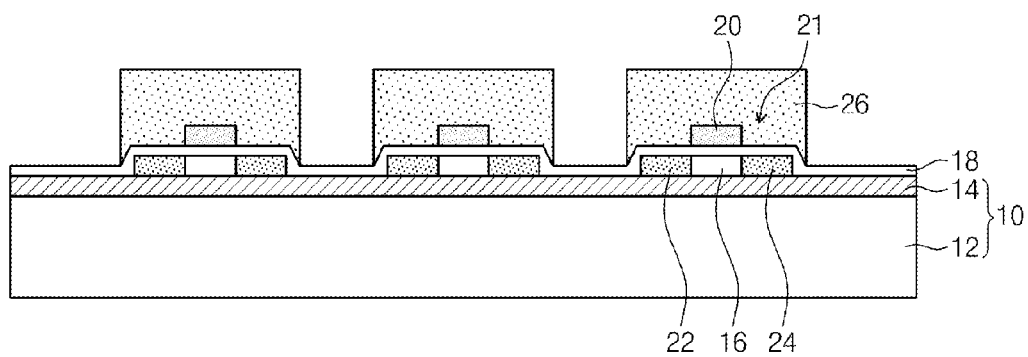

Referring to FIG. 6, a photo resist pattern 26 is formed on TFT 21 including the gate electrode 20 and the source/drain impurity regions 22 and 24. Here, the photoresist pattern 26 may be formed on the TFT 21 and the active layer 16 through a third photolithography process.

Figure 7:
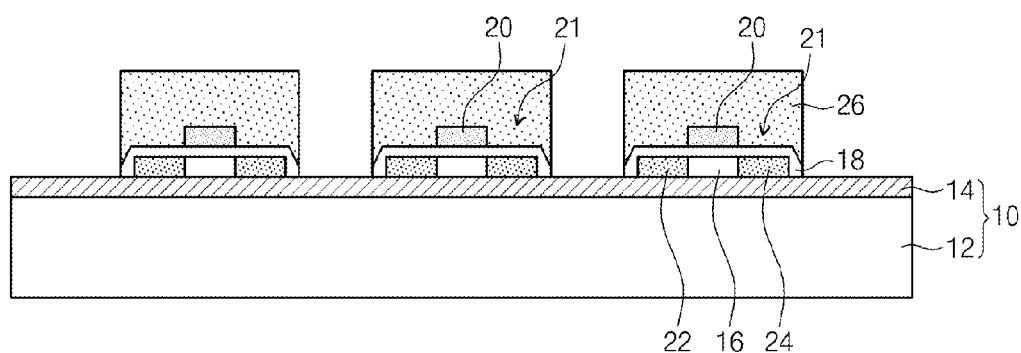

Referring to FIG. 7, the buried insulation layer 14 of the first substrate 10 is exposed by removing the gate insulation layer 18 that is exposed by the photoresist pattern 26. Here, the gate insulation layer 18 may be removed through a third etching process that uses the photoresist pattern 26 as an etching mask. The third etching process may be performed through a dry etching method that removes the gate insulation layer 18 anisotropically. At this point, the gate insulation layer 18 may be removed by an etching gas that has a high etch selectivity with respect to the buried insulation layer 14. For example, the etching gas of the silicon nitride layer may include CF-based gas such as CF4, CH2F2, and CHF3.

Figure 8:
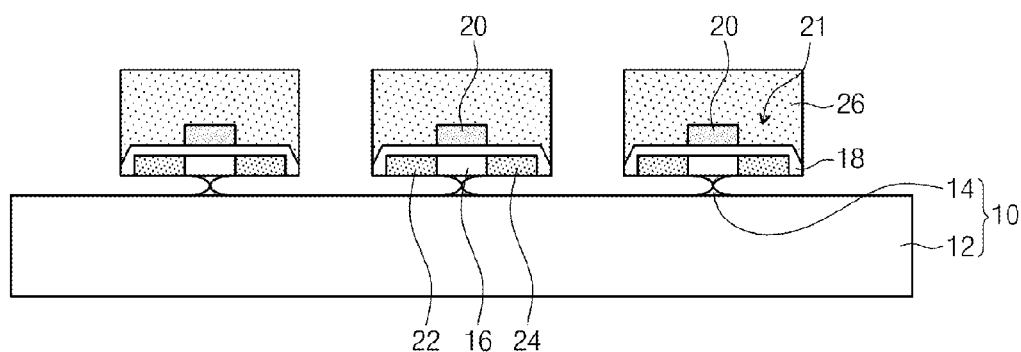

Referring to FIG. 8, an under cut is formed at the bottom of the TFT 21 by removing the buried insulation layer 14 isotropically. At this point, a portion of the buried insulation layer 14 remains to support the TFT 21 on the wafer 12. The buried insulation layer 14 may be removed by a fourth etching process that uses the photoresist pattern 26 and the gate insulation layer 18 as an etching mask. For example, the fourth etching process may be performed through a wet etching method that removes buried insulation layer 14 isotropically.

For example, the buried insulation layer 14 may be isotropically removed by an etching solution with buffered HF. The buffered HF solution is provided through which the buried insulation layer 14 of the silicon oxide layer has a higher etch selectivity than the gate insulation layer 18 of the silicon nitride layer.

Accordingly, the method of manufacturing a semiconductor device according to the first embodiment of the present invention uses a wet etching method that uses an etching solution through which the buried insulation layer 14 has a higher etch selectivity than the gate insulation layer 4, and thus does not damage the gate insulation layer 18 and allows the TFT 21 to be separated from the first substrate 10 without difficulties.

Next, a hard bake process may be further performed on the photoresist pattern 26 that is used as an etching mask during the fourth etching process. The reason is that the photoresist pattern 26 may be damaged or softened due to moisture during the third and fourth etching processes such that stamp adhesion of a next process may become difficult.

Figure 9:
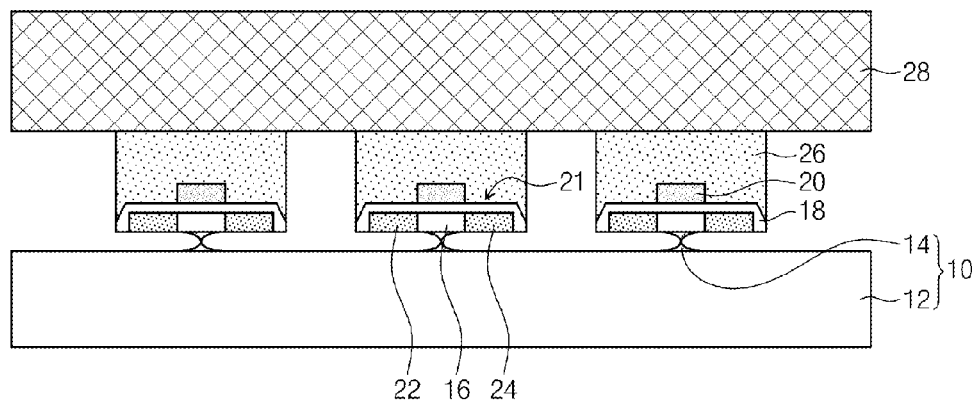

Referring to FIG. 9, the photoresist pattern 26 on the TFT 21 is fixed at the stamp 28, and the TFT 21 is separated from the first substrate 10. The stamp 28 is attached to the photoresist pattern 26 to physically fix the TFT 21 at the bottom of the photoresist pattern 26, and to separate the TFT 21 from the first substrate 10. For example, the stamp 28 may include an adhesive material having excellent adhesiveness such as Polydimethylsiloxane (PDMS) at the surface contacting the photoresist pattern 26. Additionally, the stamp 28 includes a substrate such as glass and an adhesive including PDMS at the surface of the substrate.

Figure 10:
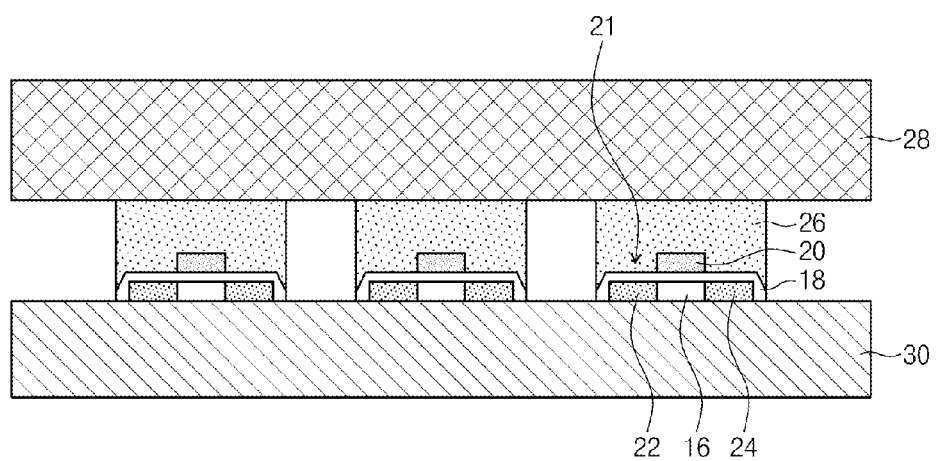

Referring to FIG. 10, the TFT 21 is transferred on a second substrate 30 on which an adhesive is coated. Here, the second substrate 30 may include a transparent and flexible plastic substrate. Additionally, the adhesive includes a petrochemical adhesive such as epoxy, silicon, het melt, PVAc, etc.

Figure 11:
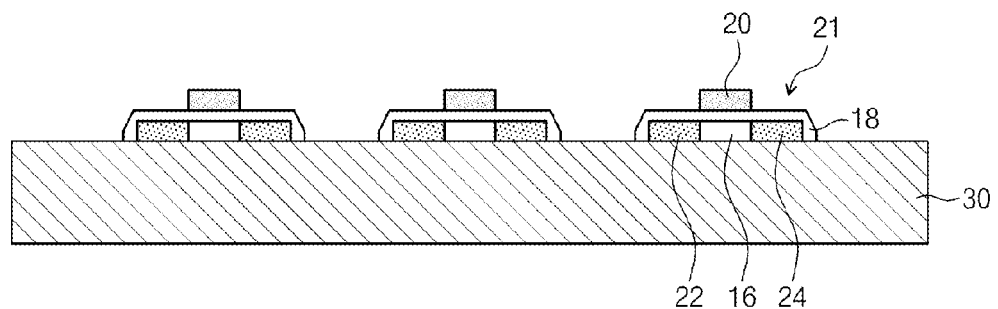

Referring to FIG. 11, the stamp 28 and the photoresist pattern 26 are removed. The photoresist pattern 26 may be easily removed by a volatile solvent such as alcohol. In addition, an adhesive between the second substrate 30 and the TFT 21 can be also melted by a volatile solvent. The photoresist pattern 26 is exposed to UltraViolet (UV) first before being fixed to the stamp 28, and may be removed by development solution, which is different from an adhesive.

Although not shown, a first interlayer insulation layer is deposited on the TFT 21 and a contact hole is formed to expose the source/drain impurity regions 22 and 24 through a fourth photolithography process and a fifth etching process. Moreover, a conductive metal layer is deposited in the contact hole and on the interlayer insulation layer, and wirings including source/drain electrodes are formed through a fifth photolithography process and a sixth etching process. Furthermore, a second interlayer insulation layer and wirings may be further formed on the second substrate 30.

As a result, the method for manufacturing a semiconductor device according to the first embodiment of the present invention prevents a damage of the gate insulation layer 18 when the TFT 21 is separated from the first substrate 10 since the gate insulation layer 18 is formed of a material different from the buried insulation layer 14 of the first substrate 10.

Additionally, after the TFT 21 that requires a manufacturing process of a high temperature is formed on the first substrate 10, it can be transferred on the second substrate 30 that is relatively vulnerable to a high temperature. Thus, production yield can be improved.

Second Embodiment

In relation to a method for manufacturing a semiconductor device according to a second embodiment of the present invention, a gate electrode and a gate insulation layer are formed into a gate stack and an interlayer insulation layer is formed on the gate stack. Thus, the method prevents the gate insulation layer from being damaged by an etching solution of a buried insulation layer during separating of a TFT from a SOI substrate.

FIGS. 12 through 23 are manufacturing sectional views illustrating the method for manufacturing a semiconductor device according to the second embodiment of the present invention.

Figure 12:
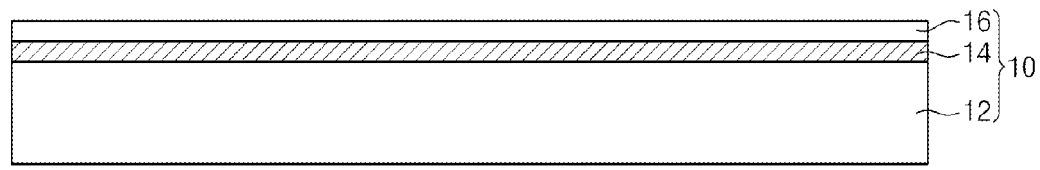
FIGS. 12 through 23 are manufacturing sectional views illustrating a method for manufacturing a semiconductor device according to a second embodiment of the present invention.

Referring to FIG. 12, a first substrate 10, where a buried insulation layer 14 and an active layer 16 are stacked, is prepared on a wafer 12. The buried insulation layer 14 includes a silicon oxide layer and the active layer 16 includes a single crystalline silicon layer. For example, the first substrate 10 may include a SOI substrate with the active layer 16 whose thickness is about 290 nm.

Figure 13:
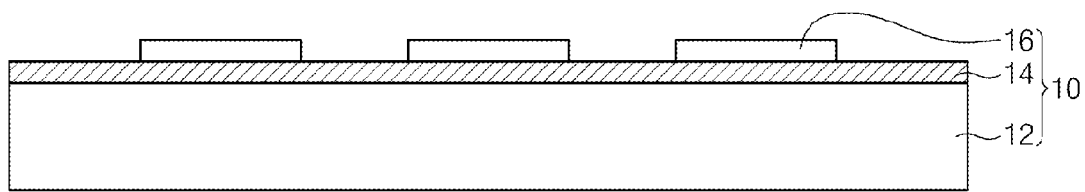

Referring to FIG. 13, the active layer 16 of the first substrate 10 is divided. Here, the active layer 16 may be formed of an opaque single crystalline silicon thin layer used as a channel layer of a TFT. Accordingly, an island process of the active layer 16 may be a process required for improving transmittance in a display device using TFT. For example, the active layer 16 may be divided by a first photolithography process and a first etching process.

Figure 14:
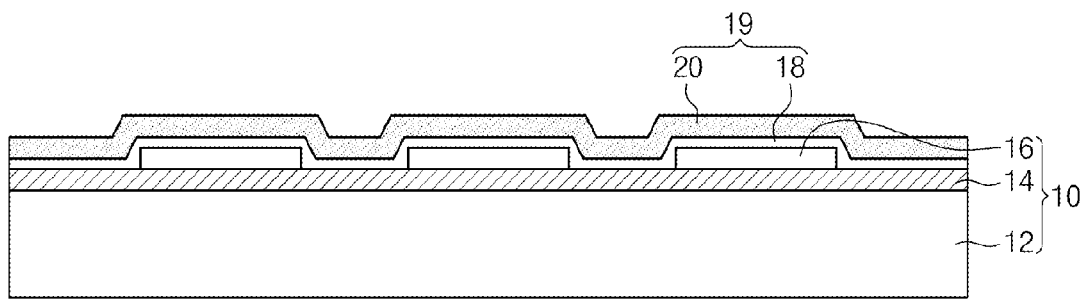

Referring to FIG. 14, a gate insulation layer 18 and a gate electrode 20 are formed on an entire surface of the first substrate 10 including the active layer 16. The gate insulation layer 18 includes a silicon oxide layer. The gate insulation layer 18 may be formed through a rapid thermal process method requiring an atmosphere of a high temperature of more than about 200° C. or a CVD method. The gate electrode 20 may include silicon doped with conductive impurity, conductive metal, or metal silicide, which is formed through a CVD method or a sputtering method.

Figure 15:
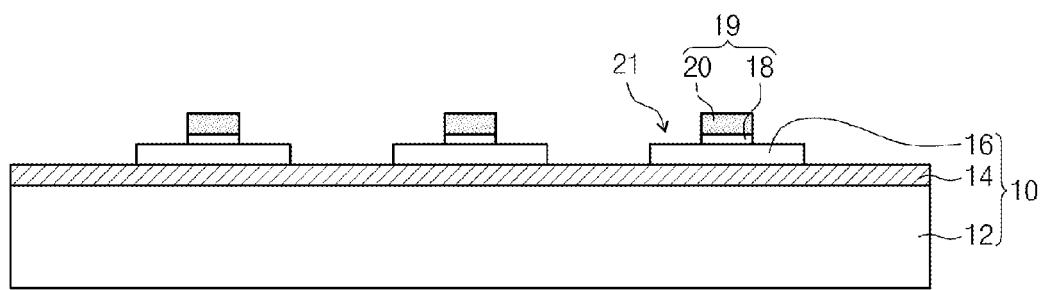

Referring to FIG. 15, a gate stack including the gate insulation layer 18 and the gate electrode 20 is formed on the active layer 16. Here, the gate electrode 20 and the gate insulation layer 18 may be patterned into the gate stack 19 on the active layer 16 through a second photolithography process and a second etching process. The second etching process may be performed through a dry etching method that removes the gate electrode 20 and the gate insulation layer 18 anisotropically.

Figure 16:
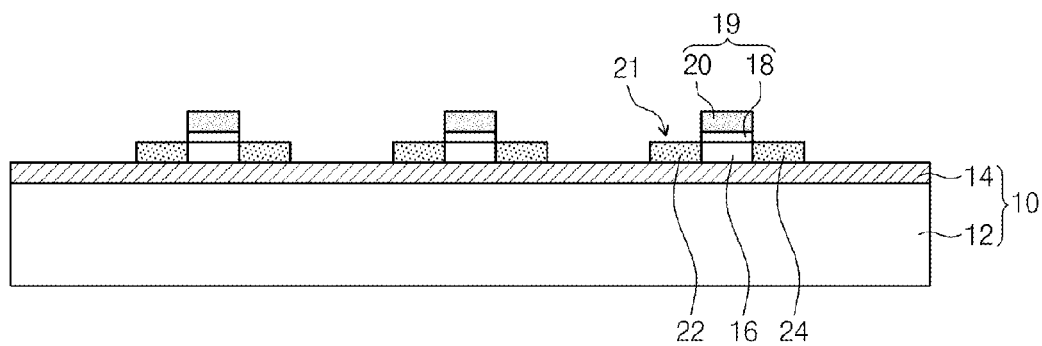

Referring to FIG. 16, source/drain impurity regions 22 and 24 are formed by ion-implanting conductive impurity on active regions 16 at both sides of the gate stack 19. The source/drain impurity regions 22 and 24 may be formed through a self align ion implantation method that uses the gate stack 19 as an ion implantation mask. As mentioned above, the conductive impurity may include a p-type impurity and an n-type impurity. The TFT 21 may be formed into a PMOS transistor or an NMOS transistor, depending on kinds of conductive impurities that are ion-implanted on the source/drain impurity regions 22 and 24. When PMOS and NMOS TFTs 21 are simultaneously designed on the first substrate 10, it is necessary to sequentially ion-implant conductive impurities of different kinds on respectively different regions. Each time conductive impurity is ion-implanted, a photolithography process is necessarily required to form an ion implantation mask that selectively exposes a corresponding region. Accordingly, when the PMOS and NMOS TFTs 21 are realized on the first substrate 10 at the same time, a plurality of photolithography processes and ion implantation processes are additionally required.

Figure 17:
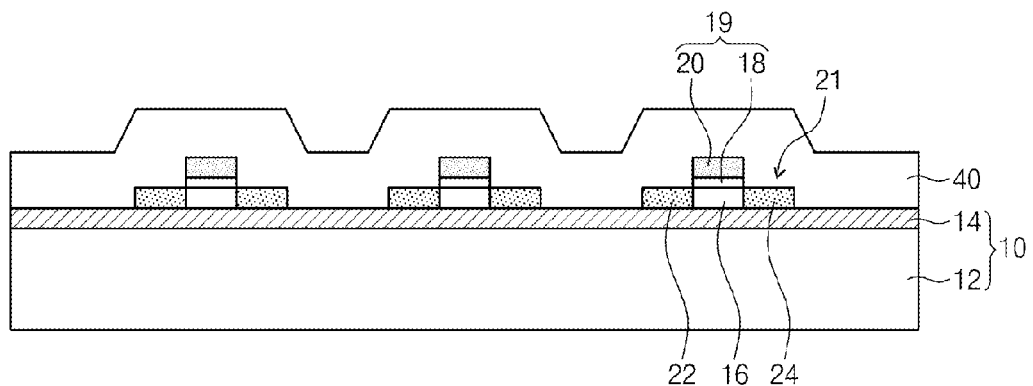

Refer to FIG. 17, an interlayer insulation layer 40 is formed on an entire surface of the first substrate 10. Here, the interlayer insulation layer 40 may include a silicon nitride layer. The interlayer insulation layer 40 may be formed using a CVD method of a high temperature. In addition, the interlayer insulation layer 40 may cover the gate insulation layer 18 exposed at the gate stack 19 on the active layer 16.

Figure 18:
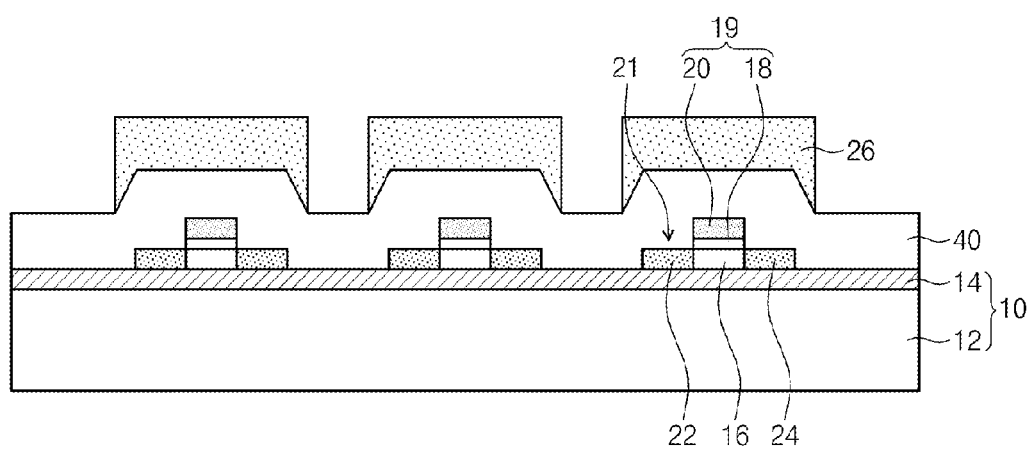

Referring to FIG. 18, a photoresist pattern 26 is formed on the interlayer insulation layer 40 above the TFT 21 including the gate electrode 20 and the source/drain impurity regions 22 and 24. Here, the photoresist pattern 26 may be formed above the TFT 21 and the active layer 16 through a third photolithography process.

Figure 19:
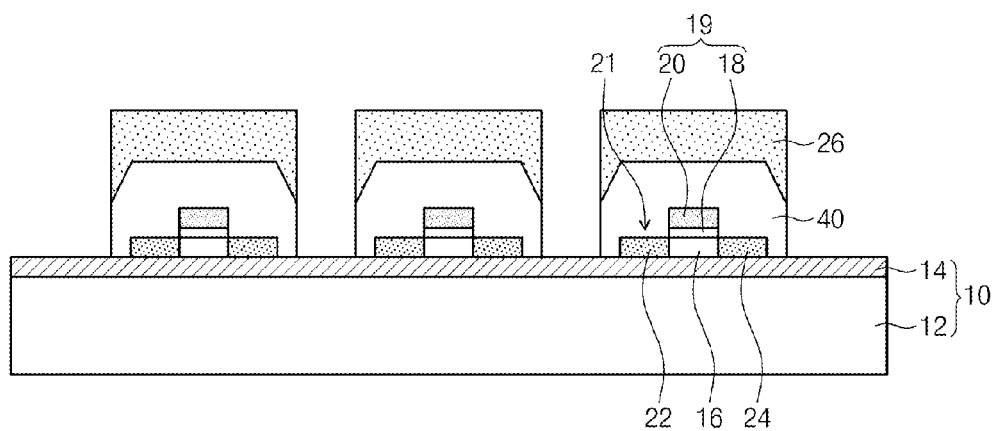

Referring to FIG. 19, the buried insulation layer 14 of the first substrate 10 is exposed by anisotropically removing the interlayer insulation layer 40 that is exposed by the photoresist pattern 26. Here, the gate insulation layer 18 may be removed through a third etching process that uses the photoresist pattern 26 as an etching mask. The third etching process may be performed through a dry etching method. At this point, the interlayer insulation layer 40 may be removed by an etching gas that has a high etch selectivity with respect to the buried insulation layer 14. For example, the etching gas of the silicon nitride layer may include CF-based gas such as CF4, CH2F2, and CHF3.

Figure 20:
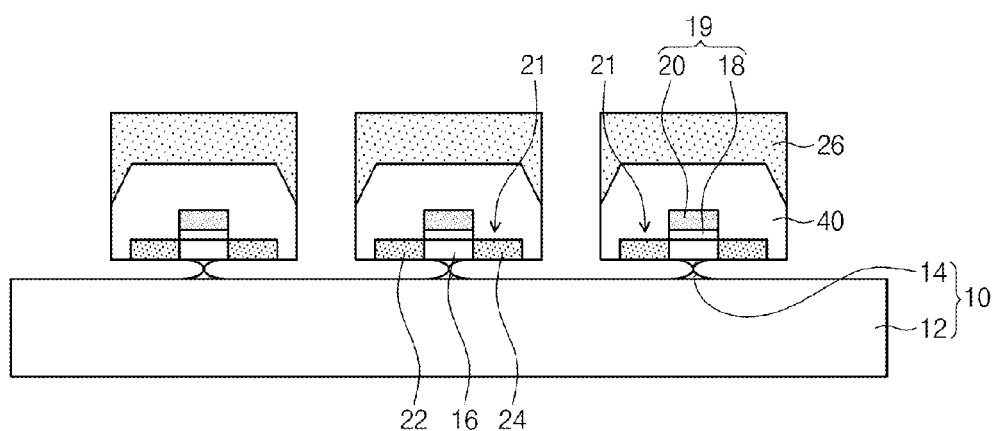

Referring to FIG. 20, an under cut is formed by removing the buried insulation layer 14 isotropically. At this point, a portion of the buried insulation layer 3 remains to support the TFT 21 on the wafer 12. The buried insulation layer 14 may be removed by a fourth etching process that uses the photoresist pattern 26 and the interlayer insulation layer 40 as an etching mask. For example, the fourth etching process may be performed through a dry etching method. For example, the buried insulation layer 14 may be isotropically removed by an etching solution with buffered HF. The buffered HF solution is provided through which the buried insulation layer 14 of the silicon oxide layer has a higher etch selectivity than the interlayer insulation layer 40 of the silicon nitride layer. At this point, the gate insulation layer 18 formed of the same silicon oxide layer as the buried insulation layer 14 may be protected from etching solution by the interlayer insulation layer 40.

Accordingly, the method of manufacturing a semiconductor device according to the second embodiment of the present invention protects the gate insulation layer 18 from the etching solution of the buried insulation layer 14 when the TFT 21 is separated because the gate insulation layer 18 and the gate electrode 20 are formed into the gate stack 19 and the interlayer insulation layer 40 is formed on the gate stack 19.

Next, a hard bake process may be further performed on the photoresist pattern 26 that is used as an etching mask during the fourth etching process. The reason is that the photoresist pattern 26 may be damaged or softened due to moisture through the third and fourth etching processes such that stamp adhesion of a next process may become difficult.

Figure 21:
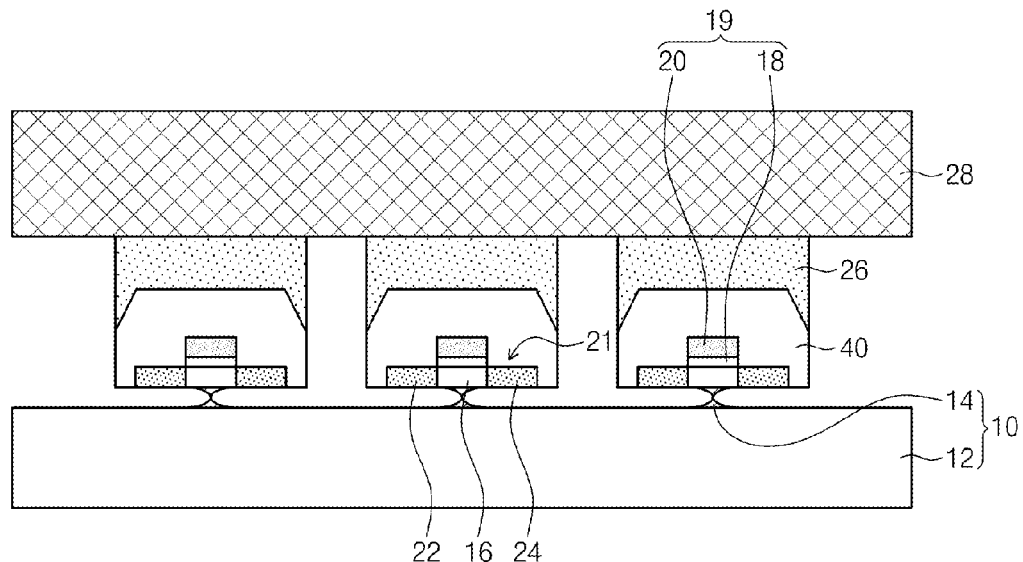

Referring to FIG. 21, the photoresist pattern 26 on the TFT 21 is fixed at the stamp 28, and the TFT 21 is separated from the first substrate 10. The stamp 28 is attached to the photoresist pattern 26 to physically fix the TFT 21 at the bottom of the photoresist pattern 26, and to separate the TFT 21 from the first substrate 10. For example, the stamp 28 may include an adhesive material having excellent adhesiveness such as PDMS at the surface contacting the photoresist pattern 26. Additionally, the stamp 28 includes a substrate such as glass and an adhesive including PDMS at the surface of the substrate.

Figure 22:
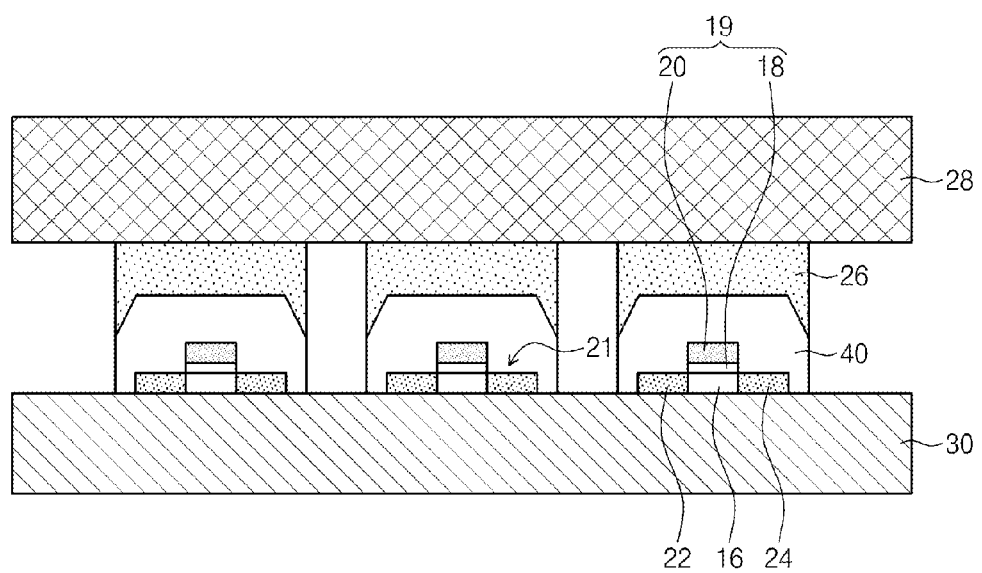

Referring to FIG. 22, the TFT 21 is transferred on a second substrate 30 on which an adhesive is coated. Here, the second substrate 30 may include a transparent and flexible plastic substrate. Additionally, the adhesive includes a petrochemical adhesive such as epoxy, silicon, het melt, PVAc, etc.

Figure 23:
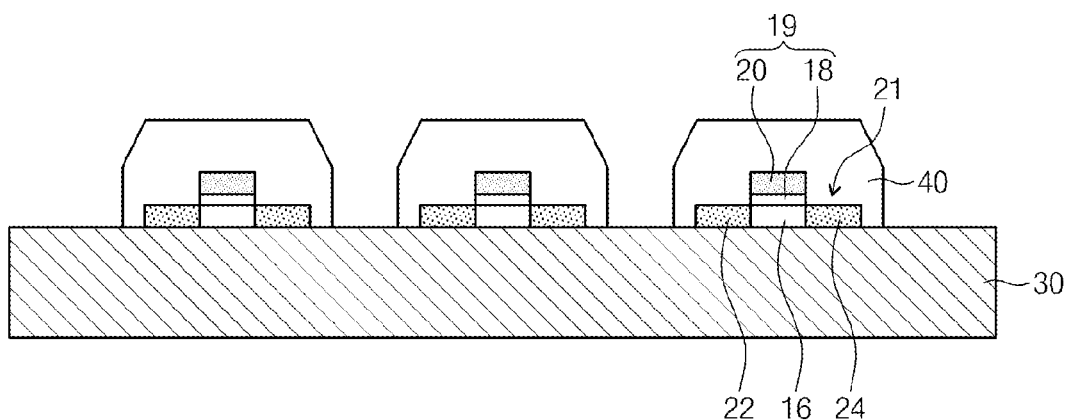

Referring to FIG. 23, the stamp 28 and the photoresist pattern 26 are removed. The photoresist pattern 26 may be easily removed by a volatile solvent such as alcohol. In addition, an adhesive between the second substrate 30 and the TFT 21 can be also melted by a volatile solvent. After the photoresist pattern 26 is exposed to UV first before being fixed to the stamp 28, it may be removed by development solution, which is different from an adhesive.

Although not shown, a second interlayer insulation layer is deposited on the TFT 21 and a contact hole is formed to expose the source/drain impurity regions 22 and 24 through a fourth photolithography process and a fifth etching process. Moreover, a conductive metal layer is deposited in the contact hole and on the interlayer insulation layer, and wirings including a source/drain electrode are formed through a fifth photolithography process and a sixth etching process. Furthermore, a third interlayer insulation layer and wirings may be further formed on the second substrate 30.

As a result, the method of manufacturing a semiconductor device according to the second embodiment of the present invention prevents the damage of the gate insulation layer 18 during separating of the TFT 21 from the first substrate 10 since the interlayer insulation layer covers the gate insulation layer 18 even if the buried insulation layer 14 and the gate insulation layer 18 are formed of the same material.

Additionally, after the TFT 21 that requires a manufacturing process of a high temperature is formed on the first substrate 10, since it can be transferred on the second substrate 30 that is relatively vulnerable to a high temperature. Thus, production yield can be improved.

According to the embodiments of the present invention, since a buried insulation layer and a gate insulation layer of a SOI substrate are formed of respectively different kinds of materials, damage of the gate insulation layer can be prevented when the buried insulation layer is removed during separating of a TFT. Therefore, production yield can be increased.

Additionally, an interlayer insulation layer is formed on a gate stack including a gate electrode and a gate insulation layer so such that the gate insulation layer is not exposed to an etching solution of the buried insulation layer during separating of a TFT. Therefore, production yield can be maximized.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for manufacturing a semiconductor device, the method comprising:
providing a first substrate where an active layer is formed on a buried insulation layer;
forming a gate insulation layer on the active layer and on the buried insulation layer;
forming a gate electrode on the gate insulation layer;
forming a source/drain region in the active layer at both sides of the gate electrode, wherein the active layer, the source/drain region, the gate insulation layer on the active layer, and the gate electrode collectively form a thin film transistor (TFT) on the buried insulation layer;
exposing the buried insulation layer around the TFT;

forming an under cut at a bottom of the TFT by partially removing the buried insulation layer; and
transferring the TFT on a second substrate.

2. The method of claim 1, wherein the gate insulation layer and the buried insulation layer are formed of insulation layer materials of respectively different kinds.

3. The method of claim 2, wherein the buried insulation layer is formed of a silicon oxide layer and the gate insulation layer is formed of a silicon nitride layer.

4. The method of claim 3, wherein the exposing of the buried insulation layer comprises:
forming a photoresist pattern on the TFT; and
etching the gate insulation layer by using the photoresist pattern as an etching mask.

5. The method of claim 4, wherein the gate insulation layer is etched using a dry etching method.

6. The method of claim 5, wherein the dry etching method uses CF-based gas.

7. The method of claim 4, wherein the buried insulation layer is removed using a wet etching method that uses the photoresist pattern and the gate insulation layer as an etching mask.

8. The method of claim 7, wherein the wet etching method of the buried insulation layer uses buffered HF solution.

9. The method of claim 7, after the etching of the buried insulation layer, further comprising performing a hard bake process on the photoresist pattern.

10. The method of claim 9, further comprising fixing the photoresist pattern at a stamp.

11. The method of claim 10, wherein the stamp comprises Polydimethylsiloxane (PDMS) on a surface that contacts the photoresist pattern.

12. The method of claim 10, wherein the photoresist pattern is exposed to UltraViolet (UV) before being fixed at the stamp.

13. The method of claim 10, wherein the photoresist pattern is removed by development solution after the TFT is transferred on the second substrate.

14. The method of claim 1, wherein the gate insulation layer and the gate electrode are formed into a gate stack on the active layer.

15. The method of claim 14, after the forming of the source/drain region, further comprising forming an interlayer insulation layer that is formed of a material different from the buried insulation layer on the gate electrode and the active region.

16. The method of claim 15, wherein the buried insulation layer is formed of a silicon oxide layer and the interlayer insulation layer is formed of a silicon nitride layer.

17. The method of claim 15, wherein the exposing of the buried insulation layer comprises:
forming a photoresist pattern on the interlayer insulation layer above the TFT; and
etching the interlayer insulation layer by using the photoresist pattern as an etching mask.

18. The method of claim 17, wherein the interlayer insulation layer is etched using a dry etching method.

19. The method of claim 17, wherein the buried insulation layer is removed by a wet etching method that uses the photoresist pattern and the interlayer insulation layer as an etching mask.

20. The method of claim 1, wherein, before forming the gate insulation layer, the active layer is partially removed to be divided into a plurality of parts that are spaced apart from each other.

* * * * *